(12) United States Patent
Wortel et al.

(10) Patent No.: US 6,263,199 B1
(45) Date of Patent: Jul. 17, 2001

(54) CIRCUIT AND METHOD OF SIGNAL FREQUENCY CONVERSION

(75) Inventors: Klaas Wortel, Phoenix; Dennis L. Welty, Mesa, both of AZ (US)

(73) Assignee: Motorola, Inc., Scaumburg, IL (US)

( * ) Notice: Subject to any disclaimer, the term of this patent is extended or adjusted under 35 U.S.C. 154(b) by 0 days.

(21) Appl. No.: 09/211,168

(22) Filed: Dec. 14, 1998

(51) Int. Cl.[7] .................................................. H04B 1/26
(52) U.S. Cl. ........................ 455/333; 455/313; 455/319
(58) Field of Search ................................... 455/333, 190.1, 455/192.2, 313, 319, 323, 326, 330; 327/116, 356, 358, 359

(56) References Cited

U.S. PATENT DOCUMENTS

| | | | |
|---|---|---|---|
| 5,525,937 | * 6/1996 | Kitazono et al. | 455/190.1 |
| 5,630,228 | * 5/1997 | Mittel | 455/326 |
| 5,841,326 | * 11/1998 | Kitazono et al. | 455/190.1 |
| 5,933,771 | * 8/1999 | Tiller et al. | 455/333 |
| 6,073,002 | * 6/2000 | Peterson | 455/326 |
| 6,108,529 | * 8/2000 | Vice et al. | 455/323 |

* cited by examiner

*Primary Examiner*—Daniel Hunter
*Assistant Examiner*—Thuan T. Nguyen
(74) *Attorney, Agent, or Firm*—Robert F. Hightower

(57) ABSTRACT

A mixer (20) has a differential transistor pair (22, 24) receiving first and second reference currents at first and second nodes (30, 34). An RF signal drives the differential transistor pair. A first switching circuit (44, 46) is coupled to the first node and a second switching circuit (52, 54) is coupled to the second node. An LO signal drives the first and second switching circuits. The first and second switching circuit each have first and second outputs that are cross-coupled at output nodes (48, 50) to provide a differential IF output current representative of the sum and difference between the frequency of the RF signal and the frequency of the LO signal.

18 Claims, 1 Drawing Sheet

CIRCUIT AND METHOD OF SIGNAL FREQUENCY CONVERSION

BACKGROUND OF THE INVENTION

The present invention relates in general to frequency conversion and, more particularly, to a mixer for converting an input signal having a frequency to an output signal having a different frequency.

Most if not all wireless communication systems transmit and receive information on a modulated carrier frequency. The RF signal transmitted across the air-ways is a high frequency carrier modulated by the signal level of the transmitted information. The transmitter and receiver in the wireless communication system must frequency up-convert baseband information for transmission as an RF signal and frequency down-convert the RF signal back to baseband.

A mixer is typically used to perform the frequency up-conversion and frequency down-conversion. The mixer receives an information input signal and a local oscillator (LO) input signal and produces an output signal as the sum and difference of the frequencies of the input signals. The sum provides frequency up-conversion and the difference provides the frequency down-conversion. A filter is used to select the sum frequency or difference frequency.

One prior art mixer includes a differential transistor pair having gate terminals coupled for receiving the information input signal. A switching circuit is coupled between the drains of the differential transistor pair and a reference current source. The location of the switching circuit increases the power supply potential needed to operate the mixer while avoiding saturation of the switching circuits, current sources, and/or differential transistor pair. Moreover, the location of the switching circuit requires the DC level of the information input signal to be less than the power supply potential in order to avoid saturation of the switching circuits, current sources, and/or differential transistor pair.

Thus, a need exists for a mixer that operates with a reduced power supply potential and allows the DC level of the information input signal to operate at the power supply potential.

DETAILED DESCRIPTION OF THE PREFERRED EMBODIMENT

Figure 1:
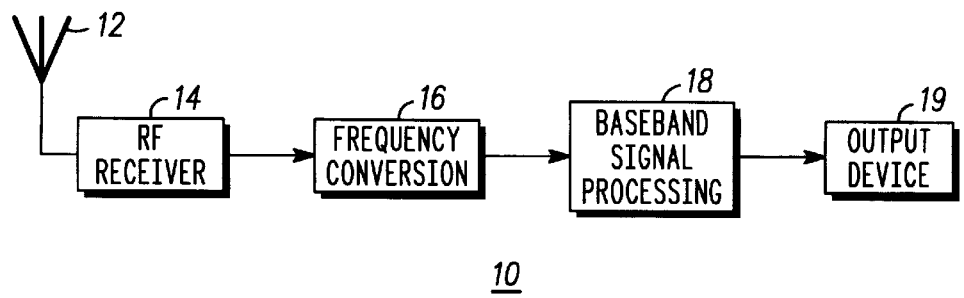
FIG. 1 is a block diagram of a receiver portion of a wireless communication device.

Referring to FIG. 1, a wireless communication system 10 is shown including an antenna 12 receiving a radio frequency (RF) signal. The wireless communication system is applicable to cellular telephones, pagers, cordless telephones, and two-way radio communicators. The RF signal is processed through an RF receiver 14 for amplification, filtering, and signal conditioning. The RF signal is a baseband signal modulating an RF carrier frequency. The RF signal is frequency down-converted by frequency conversion block 16 to recover the baseband signal. In many applications, the RF signal is first down-converted to an intermediate frequency (IF) signal and the IF signal is further down-converted to the baseband signal. Baseband signal processing block 18 performs further processing and routes the baseband signal to a user output device 19 such as a speaker or display.

The wireless communication system 10 may also include a transmitter (not shown) which would include a similar frequency conversion block to frequency up-convert the baseband signal for transmission as an RF signal.

Figure 2:
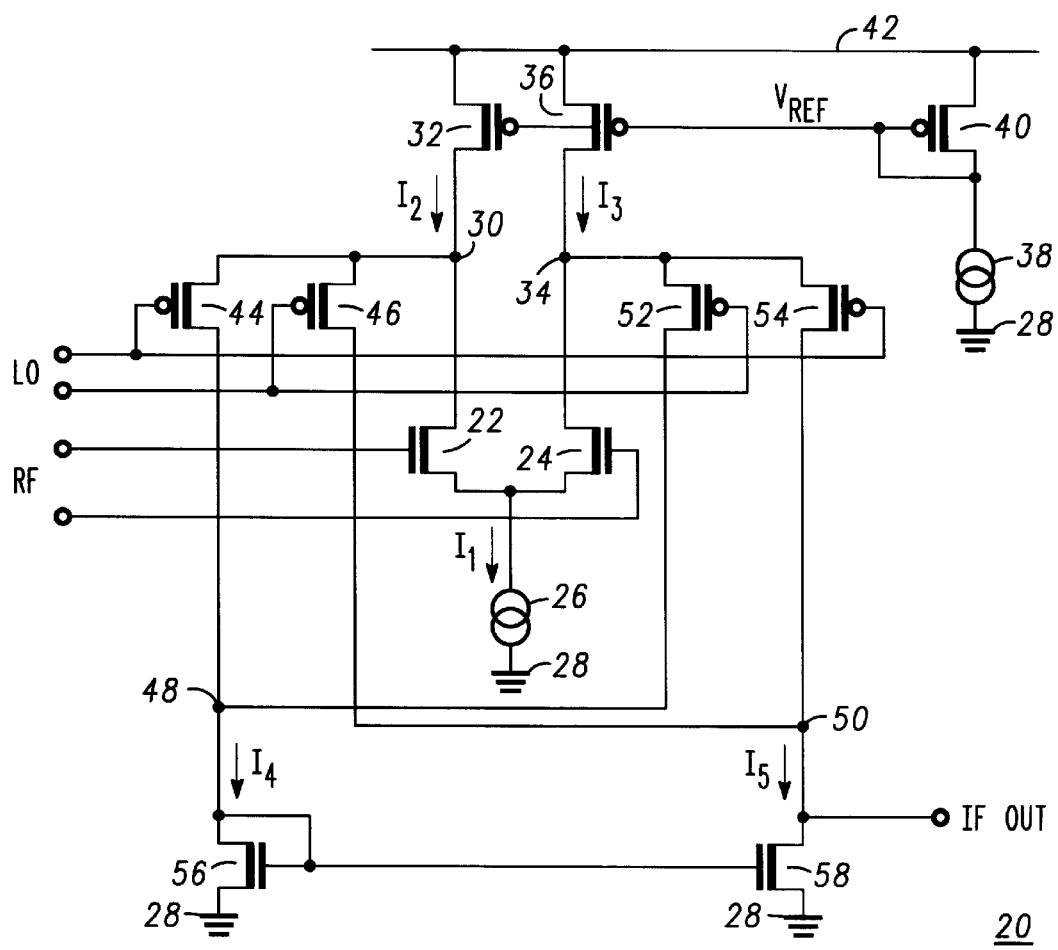
FIG. 2 illustrates further detail of the frequency conversion block of FIG. 1.

Turning to FIG. 2, further detail of a portion of the frequency conversion block 16 is shown. The frequency conversion block 16 includes a mixer 20 for converting an information input signal, e.g. the RF signal, to an output signal operating at a different frequency, e.g. the IF signal. The frequency conversion process involves mixing the information input signal with a local oscillator (LO) input signal to produce an output signal having the sum and difference of the frequencies of the input signals.

The RF signal is a differential signal having first and second components applied to the gates of the differential transistor pair 22 and 24, respectively. The sources of transistors 22 and 24 are common to current source 26 referenced to power supply conductor 28 operating at ground potential. Current source 26 sinks a reference current $I_1$ set to, for example, 100 microamps ($\mu a$) through transistors 22 and 24 as determined by the RF signal. In other words, the reference current $I_1$ is routed through first and second conduction paths of the differential transistor pair 22–24 in proportion to the RF signal. The drain of transistor 22 is coupled to node 30, which receives reference current $I_2$ from current source transistor 32. The drain of transistor 24 is coupled to node 34, which receives reference current $I_3$ from current source transistor 36. Current source 38 provides a current to diode-connected transistor 40. Transistor 40 provides a reference voltage $V_{REF}$ to set the currents $I_2$ and $I_3$, for example, to approximately 100 $\mu a$. The sources of transistors 32, 36, and 40 are coupled to power supply conductor 42 operating at a positive potential such as $V_{DD}$=1.6 volts.

Transistors 44 and 46 are p-channel devices, each having a source coupled to node 30 and a gate coupled for receiving a component of a differential LO signal. The drain of transistor 44 is coupled to node 48, and the drain of transistor 46 is coupled to node 50. Transistors 44 and 46 operate as a switching circuit to route current from node 30 to either node 48 or node 50 depending on the polarity of the LO signal. Transistors 52 and 54 are p-channel devices, each having a source coupled to node 34 and a gate coupled for receiving a component of the differential LO signal. The drain of transistor 52 is coupled to node 48, and the drain of transistor 54 is coupled to node 50. Transistors 52 and 54 operate as a switching circuit to route current from node 34 to either node 48 or node 50 depending on the polarity of the LO signal. The switching circuit 44–46 has an input coupled to node 30 and first and second outputs coupled to nodes 48 and 50. The control inputs of the switching circuit 44–46 are coupled for receiving the LO signal. The switching circuit 52–54 has an input coupled to node 34 and first and second outputs cross-coupled with the first and second outputs of the switching circuit 44–46 at nodes 48 and 50. The control inputs of the switching circuit 52–54 are coupled for receiving the LO signal.

In one application, the RF signal has a frequency of 10.7 MHz. When the voltage on the gate of transistor 22 is greater than the voltage on the gate of transistor 24, then more of the current $I_1$ flows through transistor 22 than flows through transistor 24. When the voltage on the gate of transistor 24 is greater than the voltage on the gate of transistor 22, then more of the current $I_1$ flows through transistor 24 than flows through transistor 22.

The LO signal is typically a differential square-wave or hard-clipped sine-wave having first and second components with a frequency of say 11.15 MHz. When the voltage on the gate of transistor 44 is low and the voltage on the gate of transistor 46 is high, then transistor 44 is conductive and transistor 46 is non-conductive. Likewise, when the voltage on the gate of transistor 54 is low and the voltage on the gate of transistor 52 is high, then transistor 54 is conductive and transistor 52 is non-conductive. When the voltage on the gate of transistor 46 is low and the voltage on the gate of transistor 44 is high, then transistor 46 is conductive and transistor 44 is non-conductive. When the voltage on the gate of transistor 52 is low and the voltage on the gate of transistor 54 is high, then transistor 52 is conductive and transistor 54 is non-conductive.

Assume the RF signal is oriented such that transistor 22 conducts 60 μa and transistor 24 conducts 40 μa of the 100 μa reference current $I_1$. The current $I_2$ is distributed 60 μa through transistor 22 and 40 μa through transistor 44 or transistor 46 depending on the orientation of the LO signal. The current $I_3$ is distributed 40 μa through transistor 24 and 60 μa through transistor 52 or transistor 54 also depending on the orientation of the LO signal. When the RF signal is oriented in the opposite polarity, transistor 22 conducts 40 μa and transistor 24 conducts 60 μa of the 100 μa reference current $I_1$. The current $I_2$ is routed 40 μa through transistor 22 and 60 μa through transistor 44 or transistor 46 depending on the LO signal. The current $I_3$ is routed 60 μa through transistor 24 and 40 μa through transistor 52 or transistor 54 also depending on the LO signal. The frequency of the LO signal is different than the frequency of the RF signal. The net result is a mixing process where sum and difference frequencies are generated in differential output currents $I_4$ and $I_5$ from nodes 48 and 50, respectively, representative of the IF signal.

Mixer 20 is applicable to frequency down-conversion and frequency up-conversion. The sum provides a frequency up-conversion and the difference provides a frequency down-conversion. The desired frequency conversion is obtained by filtering the IF output signal.

A current mirror comprising transistors 56 and 58 operates as a differential to single-ended converter to convert the differential IF currents $I_4$ and $I_5$ to a single-ended current representative of the IF signal available at IF OUT.

The present invention provides several advantages over prior art mixers. In the prior art, the switching circuit are typically coupled between the reference currents and the differential transistor pair. Recall that the RF signal is a DC level with the information content as a signal level plus or minus the DC level. In the prior art, the DC level of the RF signal had to be substantially less than the $V_{DD}$ power supply potential to avoid saturating the switching circuits, current sources, and/or differential transistor pair. With the switching circuits 44–46 and 52–54 and the differential transistor pair 22–24 both coupled to nodes 30 and 34, the DC level of the RF signal is allowed to operate at the $V_{DD}$ power supply potential.

In addition, the $V_{DD}$ power supply potential required to operate mixer 20 is reduced. The minimum $V_{DD}$ power supply potential is set by the gate-source voltage ($V_{GS}$) of transistor 56 plus the saturation voltage ($V_{SW\_SAT}$) of switching transistors (e.g. transistor 44) plus the saturation voltage ($V_{CS\_SAT}$) of reference current source transistors (e.g. transistor 32). Some applications use an over-drive voltage to the switching transistors which drives the devices past saturation. The over-drive voltage ($V_{OD}$) appears on the source terminals and must be accounted for in the power supply overhead. In the present embodiment, the $V_{DD}$ power supply potential is $V_{GS}+V_{SW\_SAT}+V_{OD}+V_{CS\_SAT}=0.8+0.3+0.2+0.3=1.6$ volts.

The embodiment shown in FIG. 2 is constructed with MOSFET devices. In an alternate embodiment, bipolar transistors can be substituted for some or all of the MOSFETs.

In summary, the present invention provides a mixer with a differential transistor pair receiving first and second reference currents at first and second nodes. An RF signal drives the differential transistor pair. A first switching circuit is coupled to the first node and a second switching circuit is coupled to the second node. An LO signal drives the first and second switching circuits. The first and second switching circuit each have first and second outputs that are cross-coupled to provide a differential IF output current representative of the difference between the frequency of the RF signal and the frequency of the LO signal. The configuration of the mixer reduces the required the $V_{DD}$ power supply potential and allows the DC level of the RF signal to operate at the $V_{DD}$ power supply potential.

What is claimed is:

1. A frequency conversion circuit, comprising:
    a differential transistor circuit having first and second inputs coupled for receiving an input signal and first and second conduction terminals coupled to first and second nodes for receiving first and second reference currents;
    a first switching circuit having an input coupled to the first node, a control input coupled for receiving a local oscillator signal, and first and second outputs coupled to first and second outputs of the frequency conversion circuit;
    a second switching circuit having an input coupled to the second node, a control input coupled for receiving the local oscillator signal, and first and second outputs coupled to the first and second outputs of the frequency conversion circuit; and
    a current mirror circuit having an input coupled to the first output of the frequency conversion circuit and an output coupled to the second output of the frequency conversion circuit for providing a single-ended output signal of the frequency conversion circuit.

2. The frequency conversion circuit of claim 1 wherein the first switching circuit includes:
    a first transistor having a first conduction terminal coupled to the first node, a second conduction terminal coupled to the first output of the frequency conversion circuit, and a control terminal coupled for receiving a first component of the local oscillator signal; and
    a second transistor having a first conduction terminal coupled to the first node, a second conduction terminal coupled to the second output of the frequency conversion circuit, and a control terminal coupled for receiving a second component of the local oscillator signal.

3. The frequency conversion circuit of claim 2 wherein the second switching circuit includes:
    a third transistor having a first conduction terminal coupled to the second node, a second conduction terminal coupled to the first output of the frequency conversion circuit, and a control terminal coupled for receiving the second component of the local oscillator signal; and
    a fourth transistor having a first conduction terminal coupled to the second node, a second conduction terminal coupled to the second output of the frequency conversion circuit, and a control terminal coupled for receiving the first component of the local oscillator signal.

4. The frequency conversion circuit of claim 3 wherein the differential transistor circuit includes:
   a first current source having an output;
   a fifth transistor having a first conduction terminal coupled to the first node, a second conduction terminal coupled to the output of the first current source, and a control terminal coupled for receiving a first component of the input signal; and
   a sixth transistor having a first conduction terminal coupled to the second node, a second conduction terminal coupled to the output of the first current source, and a control terminal coupled for receiving a second component of the input signal.

5. The frequency conversion circuit of claim 4 further including a second current source having a first output coupled to the first node for providing the first reference current and a second output coupled to the second node for providing the second reference current.

6. The frequency conversion circuit of claim 5 wherein the second current source includes:
   a seventh transistor having a first conduction terminal coupled to a power supply conductor, a second conduction terminal coupled to the first node, and a control terminal coupled for receiving a reference voltage; and
   an eighth transistor having a first conduction terminal coupled to the power supply conductor, a second conduction terminal coupled to the second node, and a control terminal coupled for receiving the reference voltage.

7. The frequency conversion circuit of claim 1 wherein the current mirror circuit includes:
   a first transistor having a control terminal and a first conduction terminal commonly coupled to the first output of the frequency conversion circuit, and a second conduction terminal coupled to a power supply conductor; and
   a second transistor having a first conduction terminal coupled to the second output of the frequency conversion circuit, a second conduction terminal coupled to the power supply conductor, and a control terminal coupled to the control terminal of the first transistor.

8. A method of converting an input signal operating at a first frequency to an output signal operating at a second frequency, comprising:
   routing a first reference current through first and second conduction paths in proportion to an input signal;
   providing second and third reference currents to the first and second conduction paths, respectively;
   switching a portion of the second current from the first conduction path and a portion of the third current from the second conduction path in response to a local oscillator signal to provide a differential current; and
   generating the output signal by converting the differential current to a single-ended current.

9. The method of claim 8 further including:
   routing the portion of the second reference current to a first output and routing the portion of the third reference current to a second output when the local oscillator signal has a first state; and
   routing the portion of the second reference current to the second output and routing the portion of the third reference current to the first output when the local oscillator signal has a second state.

10. The method of claim 8, wherein a current mirror converts the differential current is to a single-ended current.

11. A wireless communication device, comprising:
    a radio frequency (RF) receiver having an input coupled for receiving an RF signal; and
    a frequency converter including,
    (a) a differential transistor pair having first and second inputs coupled to first and second outputs of the RF receiver and first and second conduction terminals coupled to first and second nodes for receiving first and second reference currents,
    (b) a first switching circuit having an input coupled to the first node, a control input coupled for receiving a local oscillator (LO) signal, and first and second outputs coupled to first and second outputs of the frequency converter, and
    (c) a second switching circuit having an input coupled to the second node, a control input coupled for receiving the LO signal, and first and second outputs coupled to the first and second outputs of the frequency converter, and
    (d) a differential to single-ended converter having first and second inputs coupled to the first and second outputs of the frequency converter.

12. The wireless communication device of claim 11 wherein the differential to single-ended converter includes a current mirror circuit having an input coupled to the first output of the frequency converter and an output coupled to the second output of the frequency converter for providing a single-ended output signal.

13. The wireless communication device of claim 12 wherein the current mirror circuit includes:
    a first transistor having a control terminal and a first conduction terminal commonly coupled to the first output of the frequency converter, and a second conduction terminal coupled to a power supply conductor; and
    a second transistor having a first conduction terminal coupled to the second output of the frequency converter, a second conduction terminal coupled to the power supply conductor, and a control terminal coupled to the control terminal of the first transistor.

14. The wireless communication device of claim 11 wherein the first switching circuit includes:
    a first transistor having a first conduction terminal coupled to the first node, a second conduction terminal coupled to the first output of the frequency converter, and a control terminal coupled for receiving a first component of the LO signal; and
    a second transistor having a first conduction terminal coupled to the first node, a second conduction terminal coupled to the second output of the frequency converter, and a control terminal coupled for receiving a second component of the LO signal.

15. The wireless communication device of claim 14 wherein the second switching circuit includes:
    a third transistor having a first conduction terminal coupled to the second node, a second conduction terminal coupled to the first output of the frequency converter, and a control terminal coupled for receiving the second component of the LO signal; and
    a fourth transistor having a first conduction terminal coupled to the second node, a second conduction terminal coupled to the second output of the frequency converter, and a control terminal coupled for receiving the first component of the LO signal.

16. The wireless communication device of claim 15 wherein the differential transistor pair includes:

a first current source having an output;

a fifth transistor having a first conduction terminal coupled to the first node, a second conduction terminal coupled to the output of the first current source, and a control terminal coupled for receiving a first component of the input signal; and a sixth transistor having a first conduction terminal coupled to the second node, a second conduction terminal coupled to the output of the first current source, and a control terminal coupled for receiving a second component of the input signal.

17. The wireless communication device of claim 16 further including a second current source having a first output coupled to the first node for providing the first reference current and a second output coupled to the second node for providing the second reference current.

18. The wireless communication device of claim 17 wherein the second current source includes:

a seventh transistor having a first conduction terminal coupled to a power supply conductor, a second conduction terminal coupled to the first node, and a control terminal coupled for receiving a reference voltage; and an eighth transistor having a first conduction terminal coupled to the power supply conductor, a second conduction terminal coupled to the second node, and a control terminal coupled for receiving the reference voltage.

* * * * *